[12] United States Patent
Stubbs

(10) Patent No.: US 6,959,062 B1
(45) Date of Patent: Oct. 25, 2005

(54) VARIABLE DELAY LINE

(75) Inventor: Eric T. Stubbs, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/493,630

(22) Filed: Jan. 28, 2000

(51) Int. Cl.[7] .............................................. H03D 3/24
(52) U.S. Cl. ..................................................... 375/376
(58) Field of Search ................................. 375/371, 372, 375/373, 376, 375; 327/147, 152, 153, 158, 327/161, 149, 156

(56) References Cited

U.S. PATENT DOCUMENTS

| | | | |
|---|---|---|---|
| 4,156,197 A | | 5/1979 | Merrell ........................ 325/421 |
| 4,262,264 A | * | 4/1981 | Vandegraaf ..................... 331/4 |
| 4,714,924 A | * | 12/1987 | Ketzler .................. 340/825.21 |
| 5,223,755 A | * | 6/1993 | Richley ...................... 327/158 |
| 5,506,878 A | | 4/1996 | Chiang ......................... 377/39 |
| 5,691,669 A | * | 11/1997 | Tsai et al. ..................... 331/17 |
| 5,694,068 A | | 12/1997 | Rokugo ....................... 327/159 |
| 5,744,991 A | * | 4/1998 | Jefferson et al. ............ 327/158 |
| 5,764,300 A | | 6/1998 | Badger ....................... 348/536 |
| 5,771,264 A | | 6/1998 | Lane .......................... 375/376 |
| 5,790,612 A | | 8/1998 | Chengson et al. .......... 375/393 |
| 5,809,064 A | | 9/1998 | Fenton et al. ............... 375/208 |
| 5,815,016 A | | 9/1998 | Erickson ..................... 327/158 |
| 5,818,365 A | | 10/1998 | Hush et al. ................. 341/100 |
| 5,844,954 A | * | 12/1998 | Casasanta et al. .......... 375/373 |
| 5,854,615 A | | 12/1998 | Hush ............................ 345/99 |
| 5,920,518 A | | 7/1999 | Harrison et al. ............ 365/233 |
| 5,923,611 A | | 7/1999 | Ryan .......................... 365/233 |
| 5,926,047 A | | 7/1999 | Harrison ..................... 327/159 |
| 5,946,244 A | | 8/1999 | Manning .................... 365/194 |
| 6,011,732 A | | 1/2000 | Harrison et al. ............ 365/194 |
| 6,259,330 B1 | * | 7/2001 | Arai ............................ 331/57 |

OTHER PUBLICATIONS

Lin, F., et al., "A Register Controlled Symmetrical DLL for Double-Data-Rate DRAM", *IEEE Journal of Solid State Circuits*, 34 (4), pp. 565-568, (Apr. 1999).

* cited by examiner

Primary Examiner—Stephen Chin
Assistant Examiner—Kevin Kim
(74) Attorney, Agent, or Firm—Schwegman, Lundberg, Woessner & Kluth, P.A.

(57) ABSTRACT

A variable delay line includes a shift register responsive to coarse adjustment control and a fine adjustment control. The variable delay line can be used in a delay lock loop within an integrated circuit. The variable delay line receives coarse and fine adjustment controls from phase comparators within a phase detector. The coarse and fine adjustment controls cause a shift register associated with the delay element to shift varying amounts, thereby causing a varying amount of delay to be added or removed from the variable delay line. The shift register can be grouped into blocks, and the shift register can shift a block at a time in response to the coarse controls. The variable delay line can also include coarse delay cells associated with one shift register and fine delay cells associated with another shift register. One shift register adds or removes coarse delay cells in response to the coarse controls, the other shift register adds or removes fine delay cells in response to the fine controls.

51 Claims, 7 Drawing Sheets

VARIABLE DELAY LINE

TECHNICAL FIELD OF THE INVENTION

The present invention relates generally to delay elements, and in particular, the present invention relates to variable delay lines used in delay lock loops.

BACKGROUND OF THE INVENTION

Electronic systems typically include circuit boards, and the circuit boards typically include semiconductor devices. Some semiconductor devices communicate with each other using clock signals for timing. For example, devices using a common clock signal can communicate with one another by driving data when sending, and latching data when receiving, using timing derived from the common clock signal.

Clock signals can be used to control timing internal to the semiconductor devices, and can also be used to control timing external to the semiconductor devices. For example, in devices having internal storage elements, or "synchronous" elements, an internal clock signal is "fanned out" to the synchronous elements internal to the device such that the internal synchronous elements can reliably communicate. These semiconductor devices can also drive data from within the device through conductors at the device boundary, and drive signal nodes external to the device.

When a clock signal is received by a semiconductor device, it undergoes a finite amount of delay when entering the device. This delay can be caused by trace impedance, input driver delay, or the like. The clock signal on the semiconductor die is, therefore, delayed with respect to the clock outside the device. When one clock signal has undergone a delay different from another clock signal, the two clock signals are said to have a phase offset. When the clock signal internal to the device has a phase offset relative to a clock signal outside the device, timing from one device to another can be upset, thereby causing errors when the devices are communicating.

Delay lock loops have been devised to add additional clock delay to the clock signal such that the total delay is substantially equal to an integer number of clock periods. If the total delay is an integer number of clock periods, the phase offset is zero. When a device is powered on, or when the device is reset, the delay lock loop begins to operate. Delay lock loops typically add or subtract a unit delay element from the internal clock path each clock period until a desired phase offset between the internal and external clock signals is reached. This can be time consuming, especially if the initial phase offset is large, or if the clock frequency is low.

For the reasons stated above, and for other reasons stated below which will become apparent to those skilled in the art upon reading and understanding the present specification, there is a need in the art for alternate methods and apparatus for controlling phase offsets between clock signals.

SUMMARY OF THE INVENTION

The above mentioned problems and other problems are addressed by the present invention and will be understood by reading and studying the following specification.

In one embodiment, a method of setting a delay value in a delay lock loop includes delaying a first signal in a variable delay line to generate a second signal, and comparing a phase of the first signal with a phase of the second signal to generate a first control signal. The method further includes delaying the first signal by a first substantially fixed amount to generate a third signal, and comparing the phase of the second signal with a phase of the third signal to generate a second control signal. Responsive to the first control signal the variable delay line is adjusted by a first delay amount, and responsive to the second control signal the variable delay line is adjusted by a second delay amount.

In another embodiment, an integrated circuit includes a variable delay line having an input node, an output node, a fine adjustment node, and a coarse adjustment node. The integrated circuit further includes a phase detector configured to compare a signal on the input node with a signal on the output node and drive signals onto the fine adjustment node and the coarse adjustment node.

DETAILED DESCRIPTION OF THE INVENTION

Figure 1:
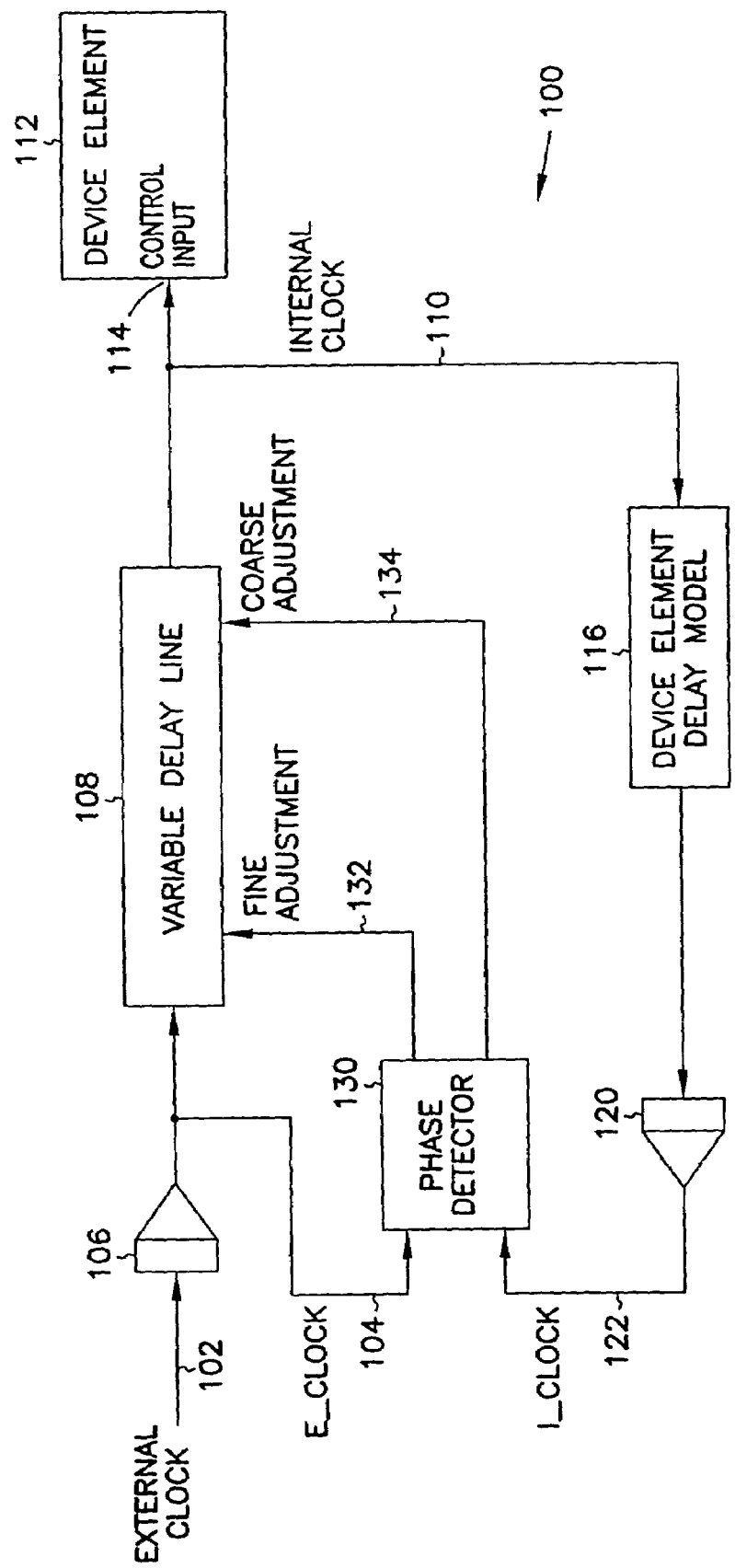
FIG. 1 is an integrated circuit that includes a delay lock loop of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

FIG. 1 shows an integrated circuit having a delay lock loop. Integrated circuit 100 includes input buffer 106, device element 112, and a delay lock loop. The delay lock loop includes variable delay line 108, phase detector 130, device element delay model 116, and delay element 120.

Integrated circuit 100 receives an external clock into input buffer 106 on input node 102. Input buffer 106 is at the device boundary, and inserts a "device boundary delay" in the signal on input node 102. A device boundary delay can be introduced by mechanisms other than input buffer 106. For example, a delay line can insert a device boundary delay. Input buffer 106 receives the external clock signal into integrated circuit 100, and provides a delayed version of the external clock to variable delay line 108 and phase detector 130 on node 104. For the purpose of description, the clock signal on node 104 is referred to herein as "E_CLOCK." E_CLOCK is delayed from the external clock on node 102, by an amount equal to the device boundary delay introduced by input buffer 106.

Variable delay line 108 receives E_CLOCK on node 104, and subjects E_CLOCK to further delay to generate the internal clock on node 110. The internal clock on node 110 is used internal to integrated circuit 100. In some embodiments, such as the embodiment shown in FIG. 1, the internal clock is fanned out to device elements within the integrated circuit. Device element 112 is representative of many possible device elements within integrated circuit 100, and can be any type of circuit element that uses the internal clock. Examples include, but are not limited to, flip-flops, latches, output registers, and output buffers. Device element 112 receives the internal clock on control input node 114. Control input node 114 can be a clock input, an output enable input, a data input, or the like. For example, in some embodiments, device element 112 is a flip-flop and control input node 114 is a clock input. In other embodiments, device element 112 is a buffer and control input node 114 is an output enable that switches an output from a high impedance state to a driven state.

The internal clock on node 110 is also fed back through device element delay model 116 and delay element 120 to phase detector 130. Device element delay model 116 has a delay characteristic that closely matches that of device element 112, and delay element 120 has a delay characteristic that closely matches that of input buffer 106. The delayed clock signal on node 122 is referred to herein as "I_CLOCK."

Phase detector 130 compares the phase of I_CLOCK to the phase of E_CLOCK and controls the delay of variable delay line 108. In the embodiment of FIG. 1, phase detector 130 generates a fine adjustment control on node 132 and a coarse adjustment control on node 134. When the phase offset between E_CLOCK and I_CLOCK is large, the coarse adjustment control can make large adjustments to the delay of variable delay line 108, and when the phase offset is small, the fine adjustment control can make smaller adjustments. Node 132 and node 134 can include multiple signal lines. For example, node 132 may include more than one signal line, and node 134 may include more than one signal line. The operation of phase detector 130 and variable delay line 108 is described in greater detail with reference to the remaining figures.

In some embodiments, when variable delay line 108 is in steady state, the sum of the delay in variable delay line 108, device element delay model 116, and delay element 120 is an integer number of clock periods. When the sum of the delay is an integer number of clock periods, E_CLOCK and I_CLOCK substantially align in phase, and phase detector 130 does not make adjustments.

In the embodiment shown in FIG. 1, when E_CLOCK and I_CLOCK are substantially aligned in phase, the internal clock on node 110 leads the external clock on node 102 by a delay substantially equal to that of device element delay model 116. This can be useful when, for example, device element 112 drives data signals or control signals off integrated circuit 100. In embodiments where device element 112 is an output register and control input node 114 is a clock input, device element delay model 116 can model the clock-to-output delay of the output register. Device element delay model 116 can also exhibit a delay that is more or less than the clock-to-output delay of the output register. This can be useful for generating specific timing relationships between the external clock and the signal driven external to integrated circuit 100.

In some embodiments, device element delay model 116 is omitted. In some of these embodiments, device element 112 is a synchronous device such as a flip-flop that drives data internal to integrated circuit 100. In other embodiments, integrated circuit 100 includes multiple delay lock loops for supplying clock signals to different portions of integrated circuit 100. For example, multiple device elements 112 of different types can exist within integrated circuit 100. When different device elements 112 exhibit different delays, multiple delay lock loops can be utilized to supply internal clock signals with desired phase relationships.

Integrated circuit 100 can be any type of integrated circuit capable of utilizing a delay lock loop. In some embodiments, integrated circuit 100 is a memory device. In some of these embodiments, delay element 112 is a synchronous output element. In others of these embodiments delay element 112 is an asynchronous output element. In other embodiments, integrated circuit 100 is an application-specific integrated circuit (ASIC). In still other embodiments, integrated circuit 100 is a processor, such as a microprocessor, digital signal processor, or the like.

The embodiment shown in FIG. 1 provides a mechanism that adjusts a variable delay quickly. Coarse adjustments can be made when phase offsets are large, and fine adjustments can be made when phase offsets are large. When integrated circuit 100 can benefit from a delay lock loop that locks quickly, in part because a substantially fixed relationship between multiple clock signals can be achieved quickly.

Figure 2:
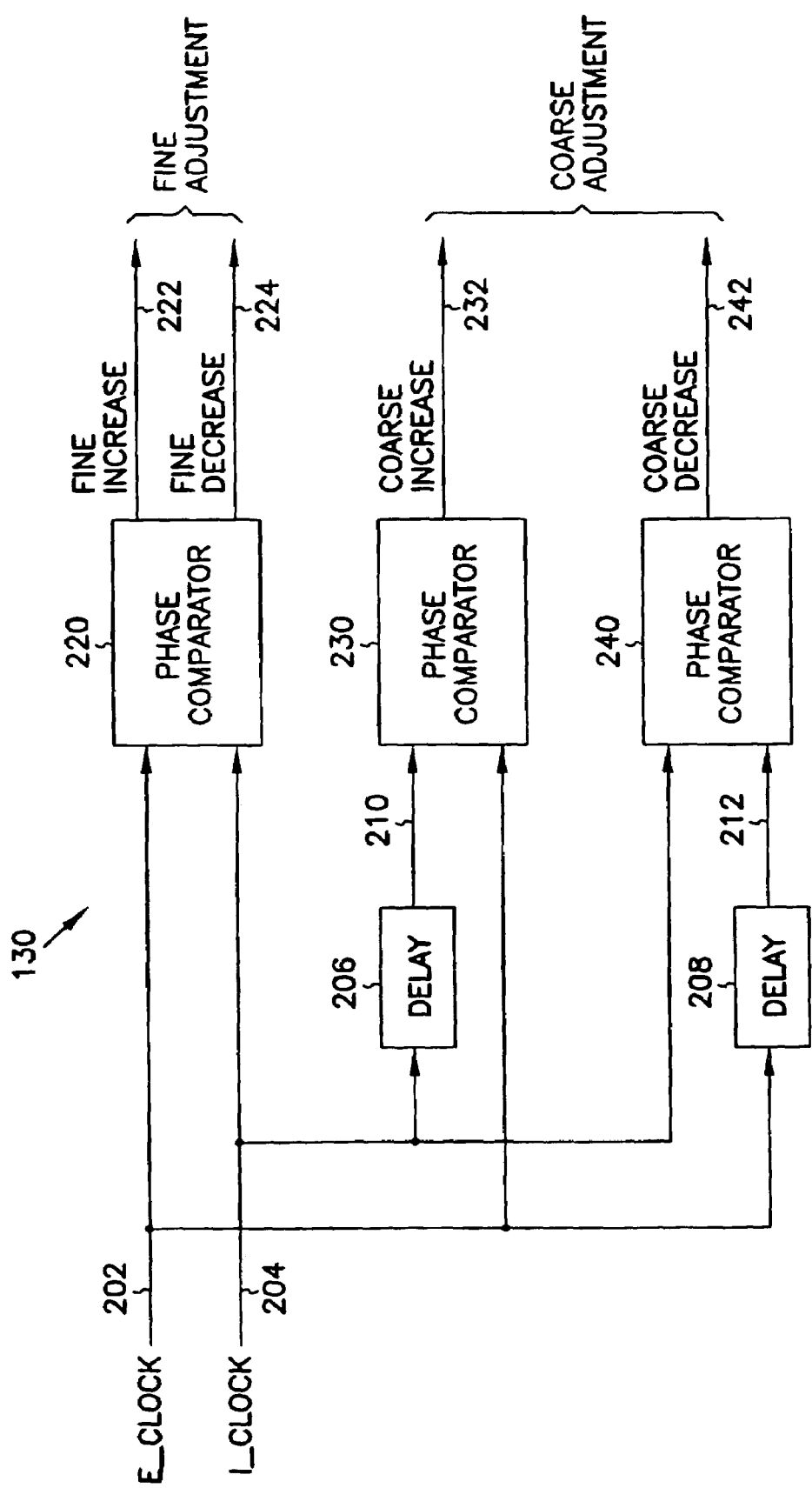
FIG. 2 is a phase detector of the present invention.

FIG. 2 shows phase detector 130. Phase detector 130 includes phase comparators 220, 230, and 240. Phase detector 130 also includes delay element 206 and delay element 208. Phase detector 130 receives E_CLOCK on node 202 and I_CLOCK on node 204. Phase comparator 220 generates a fine increase signal on node 222, and a fine decrease signal on node 224. Phase comparator 230 generates a coarse increase signal on node 232, and phase comparator 240 generates a coarse decrease signal on node 242.

Phase comparator 240 compares I_CLOCK on node 204 with a delayed E_CLOCK on node 212. When the phase of I_CLOCK lags the phase of the delayed E_CLOCK, the coarse decrease signal is asserted on node 242. Stated differently, when the phase of I_CLOCK lags the phase of E_CLOCK by an amount greater than the delay of delay element 208, phase comparator 240 asserts the coarse decrease signal on node 242. Phase comparator 230 operates in a manner similar to phase comparator 240, with the exception that I_CLOCK is delayed rather than E_CLOCK. When the phase of the delayed I_CLOCK on node 210 lags the phase of E_CLOCK, phase comparator 230 asserts the coarse increase signal on node 232. Stated differently, when the phase of I_CLOCK lags the phase of E_CLOCK by an amount greater than the delay of delay element 206, phase comparator 230 asserts the coarse increase signal on node 232.

In the embodiment shown in FIG. 2, the coarse increase signal on node 232 and the coarse decrease signal on node 242 can be used to make coarse adjustments in a variable delay line, such as variable delay line 108 (FIG. 1). In some embodiments, delay elements 206 and 208 have delay values substantially equal to the coarse delay increments controlled by the coarse increase signal and the coarse decrease signal. For example, when phase comparators 230 and 240 are used for coarse adjustment of a variable delay line such as variable delay line 108, the variable delay line can increase the delay by an amount substantially equal to the delay of delay element 206 when the coarse increase signal is asserted. As a result, I_CLOCK is retarded relative to E_CLOCK by an amount substantially equal to the delay of delay element 206. Likewise, the coarse decrease signal can cause a decrease in delay substantially equal to the delay of delay element 208. As a result, I_CLOCK is advanced with respect to E_CLOCK by an amount substantially equal to the delay of delay element 208.

If I_CLOCK lags E_CLOCK less than the delay of delay element 206, the coarse increase signal on node 232 is not asserted. Likewise, if E_CLOCK lags I_CLOCK less than the delay of delay element 208, coarse decrease signal on node 242 is not asserted. Delay element 206 and 208 determine a phase offset window, such that when the phase offset between E_CLOCK and I_CLOCK is within the phase offset window, the coarse adjustment control signals are not asserted.

Phase comparator 220 compares E_CLOCK and I_CLOCK directly. When I_CLOCK lags E_CLOCK more than a fine threshold, the fine increase signal on node 222 is asserted. Likewise, when I_CLOCK lags E_CLOCK more than a fine threshold, the fine decrease signal on node 224 is asserted. The fine increase signal on node 222 and the fine decrease signal on node 224 can be used as fine adjustment control signals on a variable delay line such as variable delay line 108 (FIG. 1). When the fine increase signal on node 222 is asserted, the delay of variable delay line 108 is increased, which causes I_CLOCK on node 204 to retard slightly. In contrast, when the fine decrease signal on node 224 is asserted, the variable delay of variable delay line 108 is decreased, which causes I_CLOCK on node 204 to advance slightly.

The embodiment shown in FIG. 2 includes three phase comparators. In some embodiments, more than three phase comparators are used. For example, multiple coarse increase signals can be generated using multiple phase comparators, each being coupled to a different delay element corresponding to delay element 206. Also, multiple coarse decrease signals can be generated using multiple phase comparators, each being coupled to a different delay element corresponding to delay element 208. In these embodiments, greater control of a variable delay line can be exercised.

Comparators 230 and 240 in the embodiment shown in FIG. 2 compare the phase of two signals after a delay has been introduced. In other embodiments, phase comparators compare the phase of two signals directly and produce a signal having a phase offset value. The phase offset value is then compared to phase offset thresholds to generate coarse and fine adjustment control signals. For example, the phase offset value can be compared to a fine threshold and a coarse threshold. When the phase offset value is larger than the coarse threshold, one of the coarse adjustment control signals can be asserted. When the phase offset value is larger than the fine threshold, but not larger than the coarse threshold, one of the fine adjustment control signals can be asserted, and when the phase offset value is less than the fine threshold, the adjustment control signals can remain de-asserted.

Figure 3:
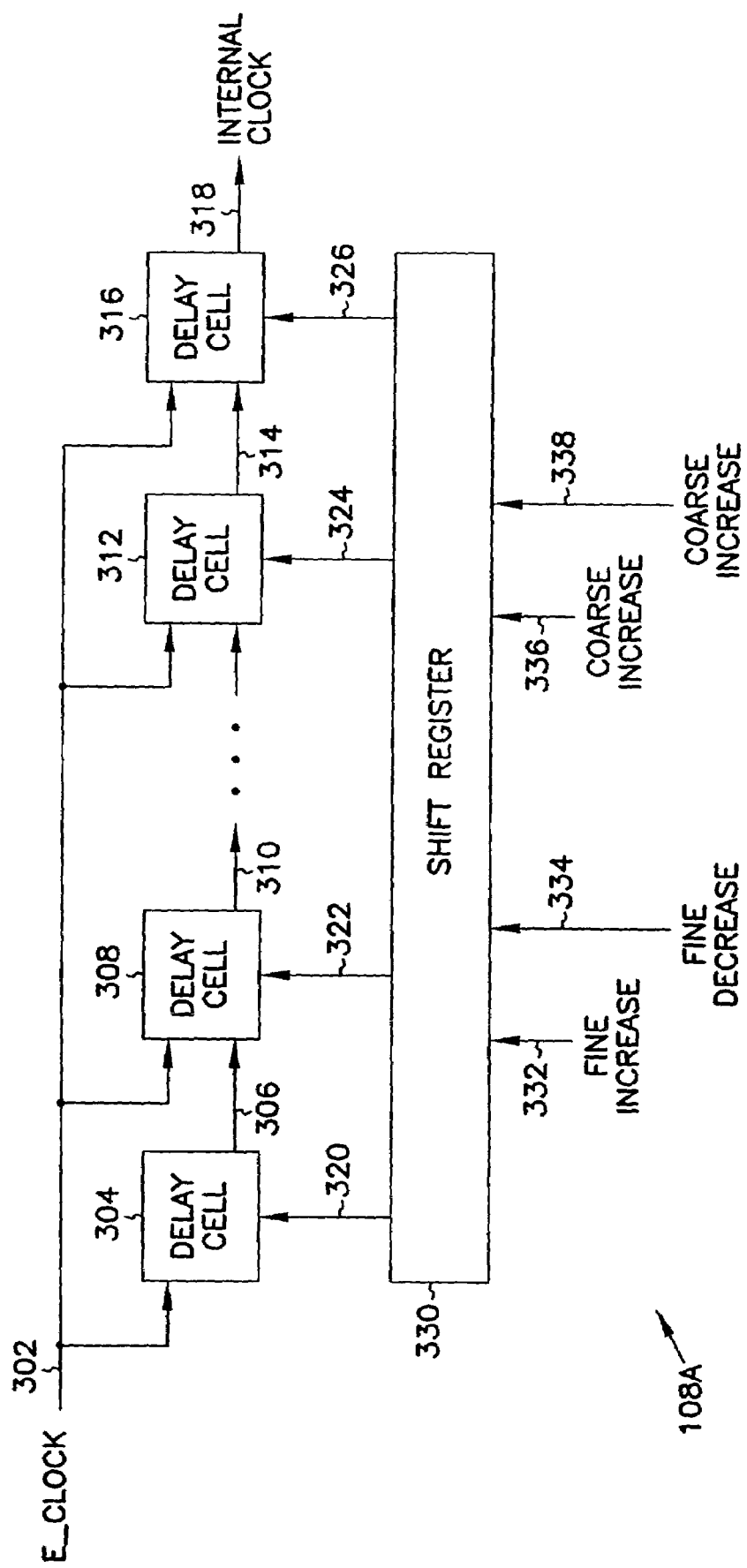
FIG. 3 is a variable delay line of the present invention.

FIG. 3 shows variable delay line 108A. Variable delay line 108A is one embodiment of variable delay line 108 (FIG. 1). Variable delay line 108A includes multiple delay cells shown in FIG. 3 as delay cells 304, 308, 312, and 316. Four delay cells are shown in variable delay line 108A; however, any number of delay cells can be utilized without departing from the scope of the present invention.

Variable delay line 108A also includes shift register 330. Shift register 330 has, as control inputs, a fine increase signal on node 332, a fine decrease signal on node 334, a coarse increase signal on node 336, and a coarse decrease signal on node 338. These control inputs correspond to the fine adjustment controls and coarse adjustment controls as shown in FIG. 2.

Shift register 330 includes multiple storage elements such as flip-flops, latches, or the like, each having a control signal output. Each storage element within shift register 330 holds a single bit in the shift register, and the state of the bit is reflected on the control signal output. The control signal outputs from shift register 330 include control signals on nodes 320, 322, 324, and 326. When a control signal output is asserted, the corresponding delay cell routes the non-E_CLOCK input to the output. For example, when the control signal on node 326 is not asserted, delay cell 316 routes E_CLOCK to node 318. This corresponds to the shortest delay in variable delay line 108A. In contrast, when the control signal on node 326 is asserted, delay cell 316 routes the signal from node 314 to node 318. In this case, the delay of at least delay cell 312 is added to the delay of delay cell 316.

Variable delay line 108A achieves variable delay by routing E_CLOCK through a variable number of delay cells, each having a "unit" delay, to produce the internal clock on node 318. The shortest delay is achieved by routing E_CLOCK through only delay cell 316. Increasing amounts of delay are achieved by adding additional delay cells to delay cell 316. For example, when delay element 312 is cascaded with delay cell 316, the delay in variable delay line 108A is increased. Additional delay cells are added when shift register 330 is "shifted left." When shift register 330 is shifted left, additional control signal outputs are asserted, and additional delay is added to variable delay line 108A.

In some embodiments, shift register 330 can be shifted by more than one storage element to create a coarse increment in the delay of variable delay line 108A. In the embodiment of FIG. 3, the coarse increase signal causes a shift left of more than one storage element, and the coarse decrease signal causes a shift right of more than one storage element within shift register 330. In other embodiments, multiple coarse increase and coarse decrease signals are used, each causing shifts of different amounts. The fine increase signal and fine decrease signal cause shifts smaller than the shifts caused by the coarse adjustment signals. In some embodiments, the fine adjustment signals cause shifts of one storage element at a time.

Figure 4:
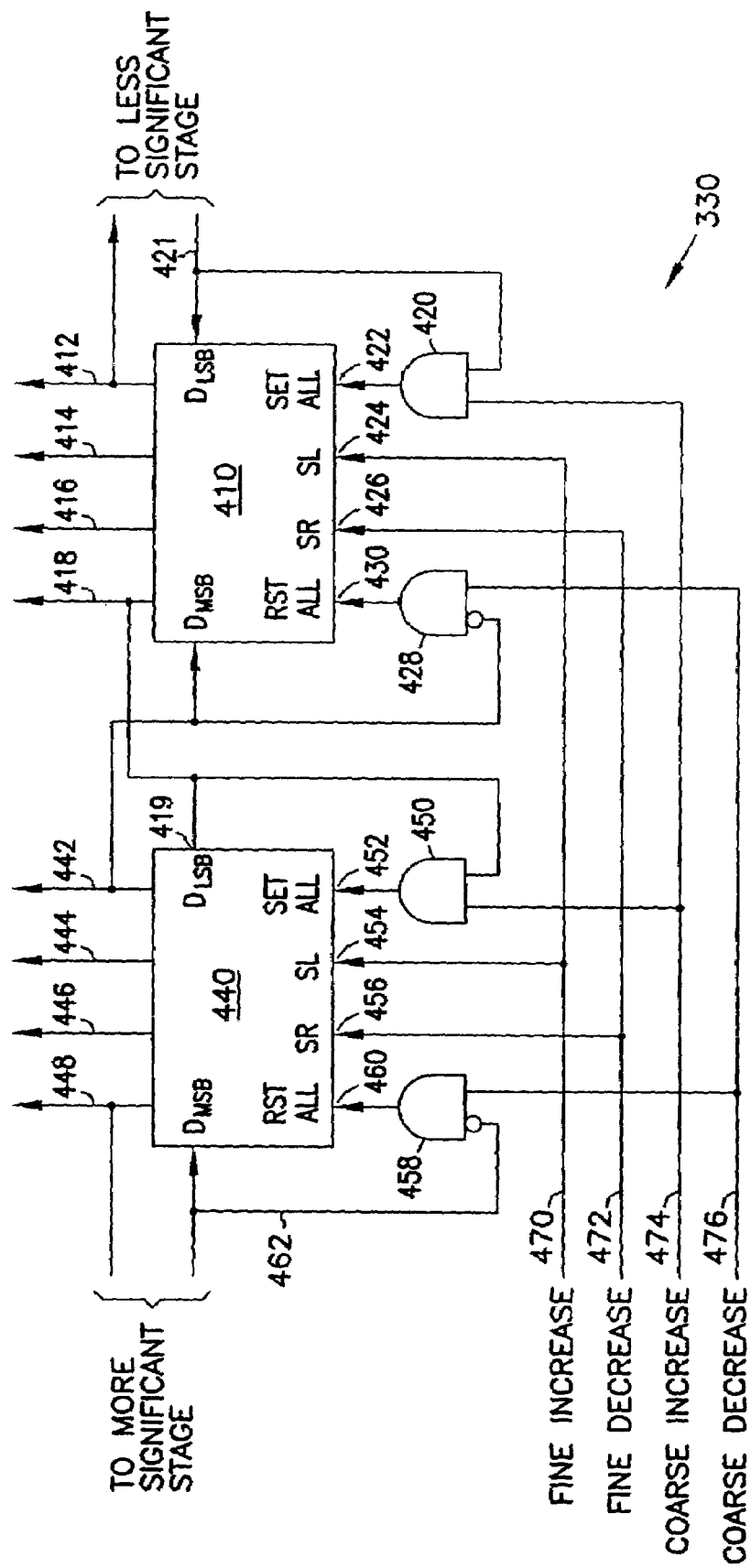
FIG. 4 is a shift register having coarse and fine control in accordance with the present invention.

FIG. 4 shows shift register 330. Shift register 330 includes storage elements arranged in blocks 410 and 440. Block 410 includes four storage elements corresponding to output nodes 412, 414, 416, and 418. Likewise block 440 includes four storage elements corresponding to output nodes 442, 444, 446, and 448. Block 410 receives a fine increase signal from node 470 on shift left input node 424, and block 440 receives the fine increase signal on shift left input node 454. Block 410 receives a fine decrease signal from node 472 on shift right input node 426, and block 440 receives the fine decrease signal on shift right input node 456. When the fine increase signal is asserted, blocks 410 and 440 perform a shift left operation. Likewise, when the fine decrease signal is asserted, blocks 410 and 440 perform a shift right operation.

The shift left and shift right operations perform a shift of a single bit. For example, if the storage elements corresponding to output nodes 412 and 414 are set, and the remaining storage elements are not set, after a shift left operation storage elements corresponding to output node 412, 414, and 416 are set. When shift register 330 is utilized in a variable delay line such as variable delay line 108A (FIG. 3), this corresponds to a single delay cell, such as delay cell 312, being inserted in the delay path.

The shift left and shift right operations work across block boundaries. For example, if the storage element corresponding to output node 418 is set, and the storage element corresponding to output node 442 is not set, a shift left operation will set the storage element corresponding to output node 442. The state of output node 418 is input to block 440 at least significant bit input 419. When block 440 performs a left shift operation, the storage element corresponding to output node 442 receives the value at the least significant bit input 419. Shift right operations work the same way as shift left operations, with the exception that they work to the right rather than the left.

The coarse increase signal on node 474 is input to logic gates 420 and 450. Logic gate 420 combines the coarse increase signal with a most significant bit from a less significant stage on node 421. The output of logic gate 420 drives the "set all" input node 422 of block 410. The set all input node, when asserted, causes all storage elements within block 410 to be set. Likewise, logic gate 450 combines the coarse increase signal with the most significant bit from block 410 and drives the set all input node 452 of block 440. When the most significant bit of block 410 is asserted, output node 418 is also asserted. If, when output node 418 is asserted, the coarse increase signal is also asserted, set all input node 452 of block 440 is also asserted. As a result, all storage elements within block 440 are set in one operation.

The coarse decrease signal on node 476 causes an operation similar to the coarse increase signal, but in the opposite direction. Coarse decrease signal on node 476 is input to logic gates 458 and 428. Logic gates 458 and 428 also receive the least significant bit of the more significant stage. If the coarse decrease signal is asserted when the least significant bit of the more significant stage is not set, the "reset all" input node is asserted causing the entire block of storage elements to be reset. For example, block 410 receives a signal from logic gate 428 on reset all input node 430. When the least significant bit of block 440 is not set, output node 442 is not asserted. If, when output 442 is not asserted, the coarse decrease signal on node 476 is asserted, reset all input node 430 will be asserted. This causes all storage elements within block 410 to be reset.

In the embodiment of FIG. 4, a shift register can be shifted left or right by a single storage element, or can be shifted left or right by four storage elements at a time. In other embodiments, blocks hold more than four storage elements, resulting in larger coarse adjustments. In other embodiments, blocks hold less than four storage elements, resulting in smaller coarse adjustments. In still other embodiments, blocks hold varying numbers of storage elements, such that different size coarse adjustments can be made.

Figure 5:
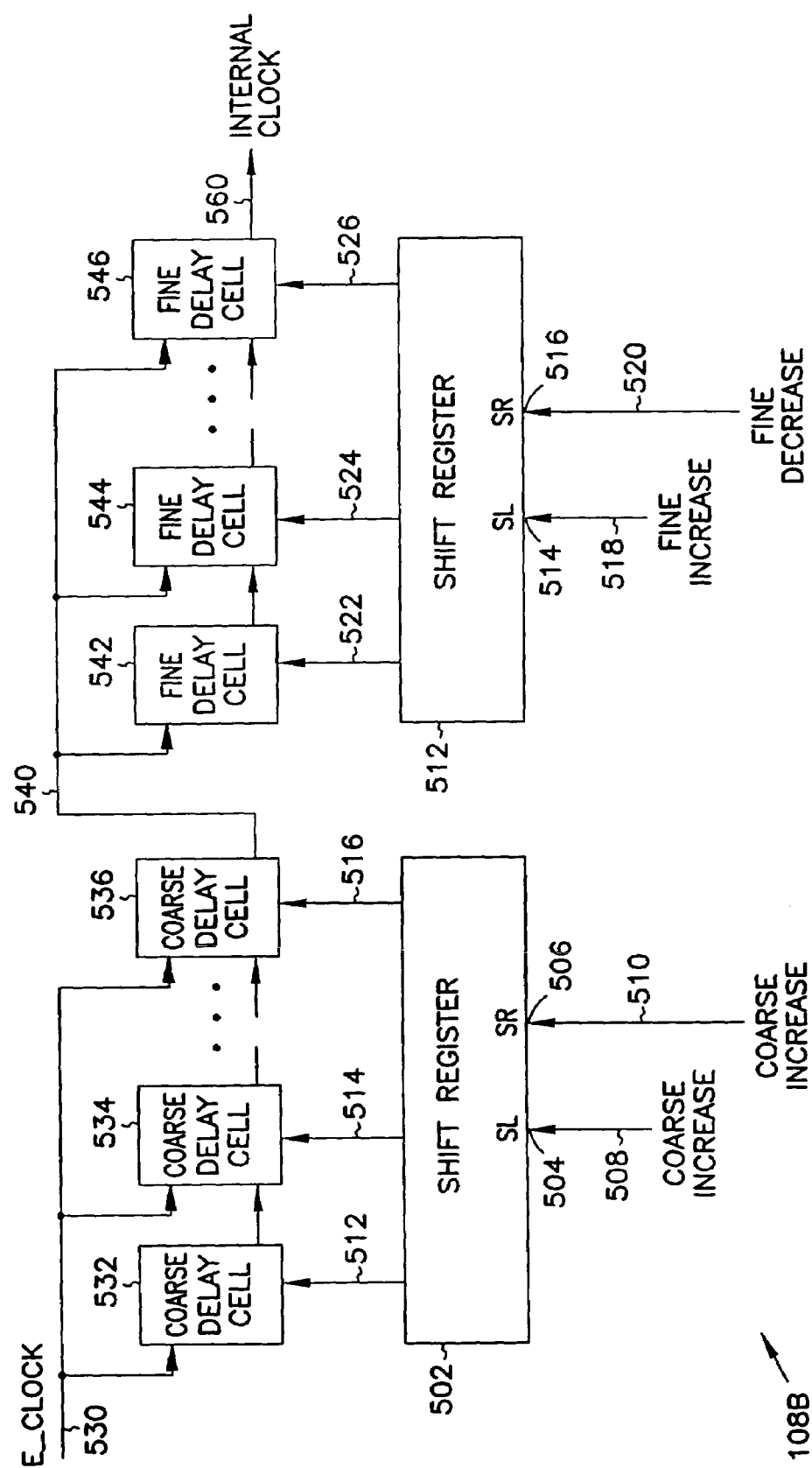
FIG. 5 is an alternate embodiment of a variable delay line of the present invention.

FIG. 5 is an alternate embodiment of a variable delay line. Variable delay line 108B is one embodiment of variable delay line 108. Variable delay line 108B is divided into a coarse adjustment portion, and a fine adjustment portion. The coarse adjustment portion includes shift register 502 and coarse delay cells 532, 534, and 536. The fine adjustment portion includes shift register 512 and fine delay cells 542, 544, and 546. The coarse adjustment portion and the fine adjustment portion each function similar to variable delay line 108A (FIG. 3). For example, shift register 502 receives the coarse increase signal from node 508 on shift left input node 504. Shift register 502 also receives the coarse decrease signal from node 510 on shift right input node 506. When shift register 502 receives an asserted signal on shift left input node 504, more output nodes become asserted. When shift register 502 receives an asserted signal on the shift right input node 506, fewer output nodes are asserted. The result is a change in the number of coarse delay cells included within the clock path of variable delay line 108B.

The coarse delay cells receive E_CLOCK from node 530 and produce an intermediate clock on node 540. The intermediate clock on node 540 is received by the fine adjustment portion of variable delay line 108B. Node 540 is input to fine delay cells 542, 544, and 546. Shift register 512, in response to signals received on shift left input node 514 and shift right input node 516, increases or decreases the number of output nodes asserted. This is similar to the operation of shift register 502. After E_CLOCK travels through coarse delay cells and fine delay cells, an internal clock is generated on node 560.

Variable delay line 108B is shown with three coarse delay cells, and three fine delay cells. Any number of coarse delay cells and fine delay cells can be used without departing from the scope of the present invention.

Figure 6:
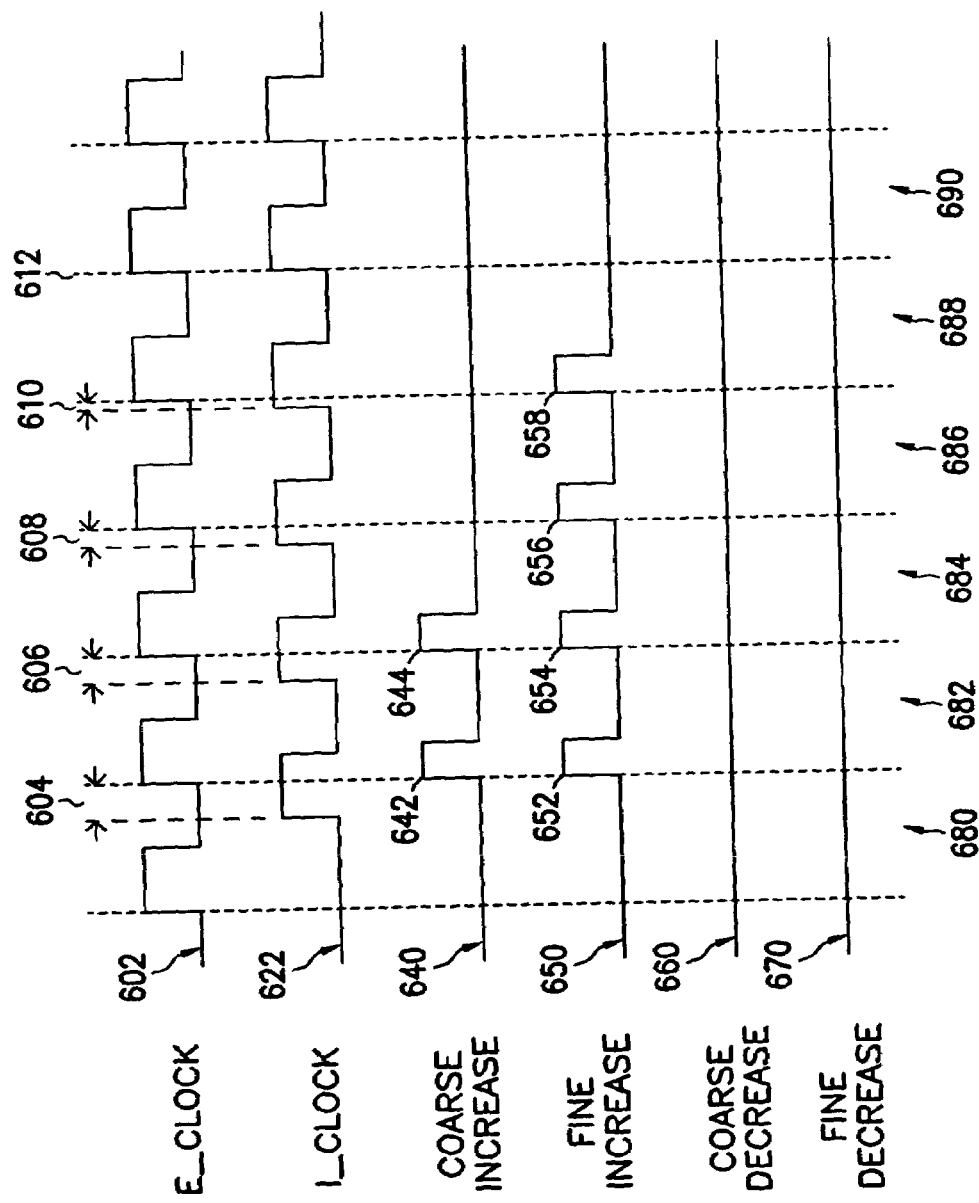
FIG. 6 shows waveforms during the operation of a variable delay line.

FIG. 6 shows waveforms of signals during the operation of a variable delay line. One variable delay line embodiment, the operation of which is described by FIG. 6, includes phase detector 130 (FIG. 2), variable delay line 108A (FIG. 3), and shift register 330 (FIG. 4). E_CLOCK 602 corresponds to E_CLOCK on node 202, and I_CLOCK 622 corresponds to I_CLOCK on node 204 (FIG. 2). The phase of E_CLOCK 602 is compared to the phase of I_CLOCK 622 during each period of E_CLOCK 602. For example, during period 680, E_CLOCK 602 is compared to I_CLOCK 622 and phase difference 604 results. Phase difference 604 is a phase difference in which E_CLOCK 602 lags I_CLOCK 622 by more than the delay of delay line 206 (FIG. 2). As a result, coarse increase signal 640 is asserted at 642. Fine increase signal 650 is also asserted at 652.

As a result of the assertions of coarse increase signal 640 and fine increase signal 650, I_CLOCK 622 is slightly retarded relative to E_CLOCK 602. When the comparison occurs again during period 682, phase difference 606 results. Phase difference 606 is still greater than the delay of delay line 206, and as a result, coarse increase signal 640 is asserted at 644, and fine increase signal 650 is asserted at 654. I_CLOCK 622 is again delayed further as a result. During period 684 the comparison of E_CLOCK 602 and I_CLOCK 622 yields phase difference 608. Phase difference 608 is less than the delay of delay line 206, and as a result, coarse increase signal 640 is not asserted, but fine increase signal 650 is asserted at 656. During period 686 the phase comparison yields phase difference 610, which results in fine increase signal 650 being asserted at 658. Thereafter, the phase comparison yields phase offset 612 which is less than a threshold in phase comparator 220, and neither coarse increase signal 640 nor fine increase signal 650 are asserted.

In the operational scenario shown in FIG. 6, E_CLOCK 602 lags I_CLOCK 622, and the delay of the variable delay line is increased until the phase of E_CLOCK 602 and I_CLOCK 622 substantially align. Coarse decrease signal 660 and fine decrease signal 670 were not used in this scenario because I_CLOCK 622 did not lag E_CLOCK 602. One skilled in the art will understand that when I_CLOCK 622 lags E_CLOCK 602, coarse decrease signal 660 and fine decrease signal 670 can be used to reduce phase offsets until E_CLOCK 602 and I_CLOCK 622 substantially align in phase.

Figure 7:
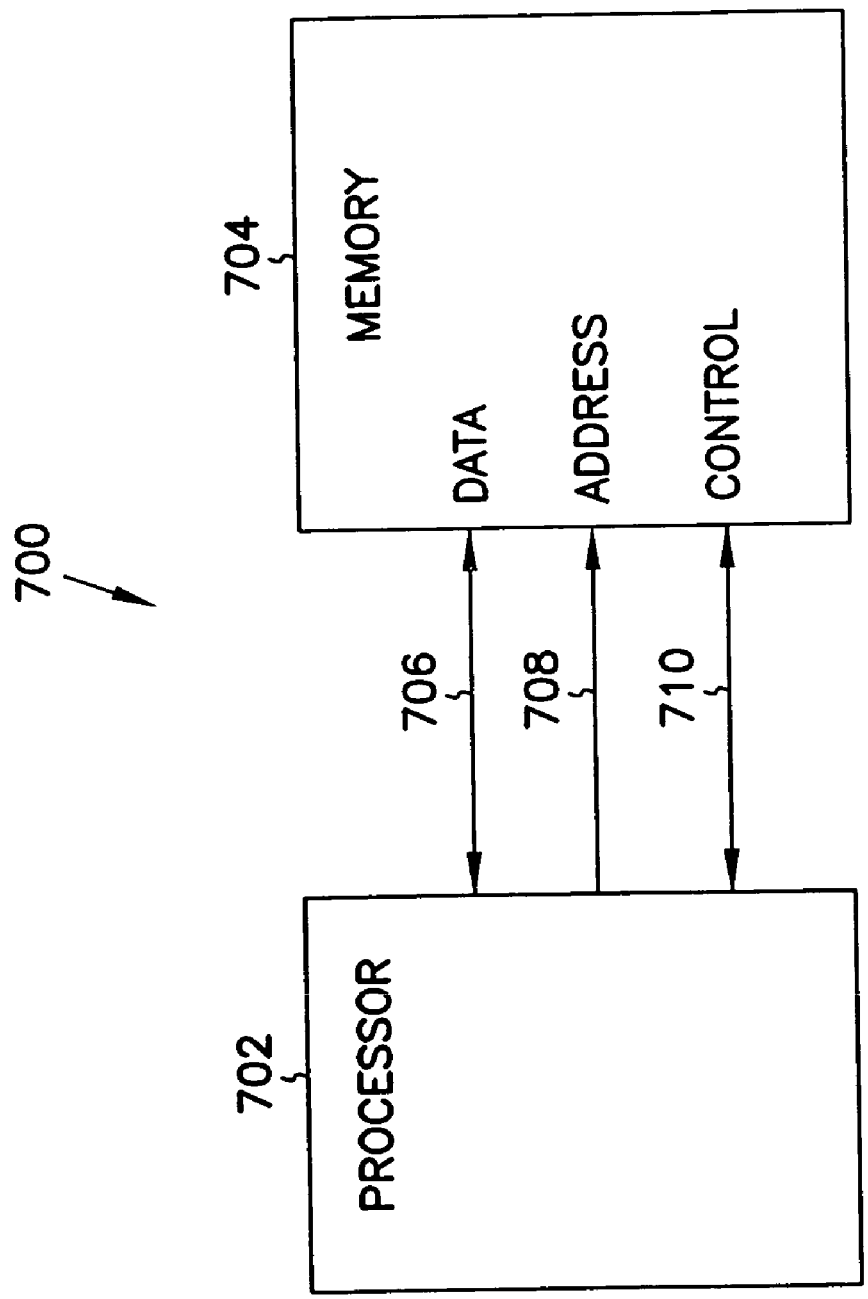
FIG. 7 shows a processing system according to the invention.

FIG. 7 shows a processing system according to the invention. System 700 includes processor 702, and memory 704. System 700 can also include many other devices such as memory controllers, input/output devices, and others.

These other devices are ommitted from FIG. 7 to accentuate the items remaining in the figure. Processor 702 can be a microprocessor, digital signal processor, embedded processsor, microcontroller, or the like. Memory 704 is a memory device that includes a delay lock loop such as the delay lock loop shown in FIG. 1. Processor 702 and memory 704 communicate using address signals on node 708, control signals on node 710, and data signals on node 706. In some embodiments, a clock signal generated by a delay lock loop internal to memory 704 is used to drive control inputs of circuit elements that drive outputs of memory 704. For example, data signals on node 706 can be driven by circuit elements such as device element 112 (FIG. 1). The delay lock loop internal to memory 704 provides a mechanism for efficient communications between processor 702 and memory 704.

CONCLUSION

A variable delay line and method therefor have been described. The variable delay line can be used in a delay lock loop within an integrated circuit. The variable delay line receives coarse and fine adjustment controls from phase comparators. The coarse and fine adjustment controls cause a shift register associated with the delay element to shift varying amounts, thereby causing a varying amount of delay to be added or removed from the variable delay line. In one embodiment, the shift register is grouped into blocks, and the shift register shifts a block at a time in response to the coarse controls. In another embodiment, one shift register adds or removes coarse delay cells in response to the coarse controls, and another shift register adds or removes fine delay cells in response to the fine controls.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of operation of a delay lock loop comprising:
    comparing a phase of a first clock signal with a phase of a second clock signal to generate a first control signal;
    delaying the first clock signal to generate a first delayed clock signal;
    comparing a phase of the first delayed clock signal with the phase of the second clock signal to generate a second control signal;
    shifting a phase of the first clock signal in response to the first control signal and the second control signal;
    responsive to the first control signal, shifting the phase of the first clock signal by a first amount; and
    responsive to the second control signal, shifting the phase of the first clock signal by a second amount, wherein the second amount is greater than the first amount.

2. A method of operation of a delay lock loop comprising:
    comparing a phase of a first clock signal with a phase of a second clock signal to generate a first control signal;
    delaying the first clock signal to generate a first delayed clock signal;
    comparing a phase of the first delayed clock signal with the phase of the second clock signal to generate a second control signal;
    shifting a phase of the first clock signal in response to the first control signal and the second control signal;
    delaying the second clock signal to generate a second delayed clock signal;
    comparing a phase of the second delayed clock signal with the phase of the first clock signal a first amount and a second amount respectively; and
    shifting the phase of the first clock signal a third amount in response to the third control signal.

3. The method of claim 2 wherein the third amount is substantially equal to the second amount.

4. A method of setting a delay value in a delay lock loop comprising:
    delaying a first signal in a variable delay line to generate a second signal;
    comparing a phase of the first signal with a phase of the second signal to generate a first control signal;
    delaying the first signal by a first substantially fixed amount to generate a third signal;
    comparing the phase of the second signal with a phase of the third signal to generate a second control signal;
    responsive to the first control signal, adjusting the variable delay line by a first delay amount; and
    responsive to the second control signal, adjusting the variable delay line by a second delay amount, the second delay amount being greater than the first delay amount.

5. The method of claim 4 further comprising:
    delaying the second signal by a second substantially fixed amount to generate a fourth signal;
    comparing the phase of the first signal with a phase of the fourth signal to generate a third control signal; and
    responsive to the third control signal, adjusting the variable delay line by a third delay amount.

6. The method of claim 5 wherein the second delay amount and the third delay amount are substantially equal.

7. The method of claim 5 wherein the first substantially fixed amount and the second substantially fixed amount are substantially equal.

8. The method of claim 5 wherein the second delay amount and the third delay amount are opposite in polarity.

9. A method of aligning a phase of a first signal external to a device and a phase of a second signal internal to the device comprising:
    receiving the first signal into the device, and subjecting the first signal to a device boundary delay to produce an internal first signal;
    delaying the internal first signal in a variable delay line to generate the second signal, the variable delay line having a fine adjustment control and a coarse adjustment control;
    delaying the second signal a substantially fixed amount to produce a delayed second signal;
    comparing the internal first signal with the second signal, and responsive thereto, driving the fine adjustment control; and
    comparing the internal first signal with the delayed second signal, and responsive thereto, driving the coarse adjustment control.

10. The method of claim 9 wherein prior to delaying the second signal or comparing the internal first signal with the second signal, the method further comprises subjecting the second signal to an additional delay substantially equal to the device boundary delay.

11. The method of claim 9 wherein the variable delay line has a second coarse adjustment control and the method further comprises:
    delaying the internal first signal the substantially fixed amount to produce a delayed internal first signal; and comparing the delayed internal first signal and the second signal, and responsive thereto, driving the second coarse adjustment.

12. The method of claim 11 wherein the first coarse adjustment and the second coarse adjustment result in adjustments of opposite polarity.

13. In a memory device having data output drivers configured to drive data signals external to the memory device, a method of aligning the data signals with an external clock signal comprising:
   receiving the external clock signal;
   delaying the external clock signal in a variable delay line having a variable delay associated therewith, to produce an internal clock signal;
   generating a first phase difference between the external clock signal and the internal clock signal;
   comparing the first phase difference to a threshold;
   when the first phase difference is above the threshold, changing the variable delay a first delay amount;
   when the first phase difference is not above the threshold, changing the variable delay a second delay amount, the second delay amount being less than the first delay amount;
   delaying the internal clock signal to produce a delayed internal clock signal;
   generating a second phase difference between the external clock signal and the delayed internal clock signal;
   changing the variable delay a third delay amount; and
   driving a control input of the data output drivers with the internal clock.

14. The method of claim 13 wherein the data output drivers are sequential devices having clock inputs, and driving a control input comprises driving the clock inputs of the sequential devices.

15. The method of claim 13 wherein the data output drivers are devices having output enable inputs, and driving a control input comprises driving the output enable inputs of the data output drivers.

16. The method of claim 13 wherein generating a second phase difference and comparing the second phase difference comprise:
   delaying the internal clock signal by an amount substantially equal to the threshold to generate the delayed internal clock signal; and
   comparing the delayed internal clock signal to the external clock signal.

17. In a memory device having data output drivers configured to drive data signals external to the memory device, a method of aligning the data signals with an external clock signal comprising:
   receiving the external clock signal;
   delaying the external clock signal in a variable delay line having a variable delay associated therewith, to produce an internal clock signal;
   generating a phase difference between the external clock signal and the internal clock signal;
   comparing the phase difference to a threshold;
   when the phase difference is above the threshold, changing the variable delay a first delay amount;
   when the phase difference is not above the threshold, changing the variable delay a second delay amount, the second delay amount being less than the first delay amount;
   driving a control input of the data output drivers with the internal clock;
   wherein generating a phase difference and comparing the phase difference comprise:
      delaying the external clock signal by an amount substantially equal to the threshold to generate a delayed external clock signal; and
      comparing the delayed external clock signal to the internal clock signal.

18. The method of claim 13 wherein the external clock signal has a period associated therewith, and the variable delay line delays the external clock signal such that the internal clock signal lags the external clock signal by an integer number of periods.

19. In a delay line having a variable delay, a method of changing the variable delay comprising:
   comparing a phase of a signal input to the delay line with a phase of a signal output from the delay line to produce a first phase difference;
   when the first phase difference is larger than a first threshold, adjusting the variable delay by a first delay amount;
   when the first phase difference is not larger than the first threshold and is larger than a second threshold, adjusting the variable delay by a second delay amount, the second delay amount being less than the first delay amount;
   delaying the signal input to the delay line to produce a third signal;
   comparing the phase of the signal output from the delay line to the third signal to produce a third delay amount; and
   adjusting the variable delay by the third delay amount.

20. The method of claim 19 further comprising:
   responsive to the first comparing, when the phase difference is smaller than the second threshold, holding the variable delay constant.

21. The method of claim 19 wherein the delay line comprises a plurality of delay elements, each of the plurality of delay elements having a unit delay, and wherein the second delay amount is substantially equal to one unit delay.

22. The method of claim 21 wherein the first delay amount is substantially equal to an integer number of unit delays.

23. A phase detector comprising:
   a first input node, a second input node, a first output node, and a second output node;
   a first phase comparator coupled to receive an external clock signal from the first input node and coupled to receive an internal clock signal from the second input node and coupled to produce a fine adjustment signal on the first output node;
   a first delay line coupled to receive the external clock signal from the first input node and coupled to produce a delayed external clock signal;
   a second phase comparator coupled to receive the delayed external clock signal from the first delay line and coupled to receive the internal clock signal from the second input node and coupled to produce a coarse increase adjustment signal on the second output node;
   a second delay line coupled to receive the internal clock signal from the second input node and coupled to produce a delayed internal clock signal; and
   a third phase comparator coupled to receive the delayed internal clock signal from the second delay line and coupled to receive the external clock signal from the first input node, and coupled to produce a coarse decrease adjustment signal on the second output node.

24. A phase detector comprising:
   a first input node, a second input node, a first output node, and a second output node;

a first phase comparator coupled between the first input node, the second input node, and the first output node;
a first delay line coupled to the first input node;
a second phase comparator coupled between the first delay line, the second input node, and the second output node;
a third output node;
a second delay line coupled to the second input node; and
a third phase comparator coupled between the first input node, the second delay line, and the third output node.

25. A phase detector comprising:
a first input node, a second input node, a first output node, and a second output node;
a first phase comparator coupled to receive clock signals from the first input node and, the second input node, and for producing a fine increase adjustment signal on the first output node and for producing a fine decrease adjustment signal on the second output node;
a first delay line coupled to the first input node and coupled to produce a first delayed signal;
a second delay line coupled to the second input node and coupled to produce a second delayed signal;
a second phase comparator coupled to receive the first delayed signal from the first delay line and coupled to the second input node for producing a coarse increase adjustment signal on a third output node; and
a third phase comparator coupled to receive the second delayed signal from the second delay line and coupled to the first input node for producing a coarse decrease adjustment signal on a fourth output node.

26. A delay lock loop comprising:
a variable delay line including a plurality of delay cells and an input connected to receive an external signal;
a shift register having a plurality of storage elements, each of the plurality of storage elements corresponding to one of the plurality of delay cells, the plurality of storage elements being arranged in a plurality of blocks of storage elements, the shift register having a fine control input node, and a coarse control input node;
a phase detector having a fine adjustment output node coupled to the fine control input node, and having a coarse adjustment output node coupled to the coarse control input node the phase detector further comprising:
    a first phase comparator operable for comparing a phase of the external signal to a phase of a variable delay signal output from the variable delay line and producing therefrom a first delay amount signal on the fine adjustment output node; and
    a second phase comparator operable for comparing a phase of a delayed version of the external signal to the variable delay signal output from the variable delay line and producing therefrom a second delay amount signal on the coarse adjustment output node.

27. The delay lock loop of claim 26 wherein the shift register is configured to shift one of the plurality of storage elements in response to an asserted signal on the fine control input node.

28. The delay lock loop of claim 26 wherein the shift register is configured to shift one of the plurality of blocks of storage elements in response to an asserted signal on the coarse control input node, such that the variable delay line changes by more than one of the plurality of delay cells in response to the asserted signal.

29. The delay lock loop of claim 26 wherein the variable delay line includes an input node and an output node, and wherein the phase detector is configured to measure a phase difference between a signal on the input node of the variable delay line and a signal on the output node of the variable delay line.

30. The delay lock loop of claim 29 wherein the phase detector is configured to assert a coarse control signal on the coarse adjustment output node when the phase difference is above a threshold, and to assert a fine control signal on the fine adjustment output node when the phase difference is below the threshold.

31. The delay lock loop of claim 26 wherein the plurality of delay cells each exhibit substantially the same delay.

32. The delay lock loop of claim 26 wherein the plurality of delay cells do not all exhibit the same delay.

33. A variable delay line comprising:
a coarse adjustment portion comprising a first plurality of delay cells and a first shift register;
a fine adjustment portion comprising a second plurality of delay cells and a second shift register, wherein each of the first plurality of delay cells has a delay value larger than that of each of the second plurality of delay cells;
a first phase comparator operable for comparing a phase of an external clock signal to a phase of a internal clock signal output from the variable delay line and producing therefrom a first delay amount signal connected to control the fine adjustment portion; and
a second phase comparator operable for comparing a phase of a delayed version of the external clock signal and a phase of internal clock signal and producing therefrom a second delay amount signal connected to control the coarse adjustment portion.

34. The variable delay line of claim 33 wherein the first shift register is configured to be responsive to coarse adjustment signals from the second phase detector.

35. The variable delay line of claim 33 wherein the second shift register is configured to be responsive to fine adjustment signals from the first phase detector.

36. An integrated circuit comprising:
a variable delay line having an input node, an output node, a fine adjustment input node, and a coarse adjustment input node;
a first phase detector configured to compare a signal on the input node with a signal on the output node and drive signals onto the fine adjustment input node; and
a second phase detector configured to compare the signal on the output node with a delayed version of the signal on the input node and drive signals onto the coarse adjustment input node.

37. The integrated circuit of claim 36 wherein the fine adjustment input node comprises:
a fine increase adjustment input node; and
a fine decrease adjustment input node.

38. The integrated circuit of claim 36 wherein the coarse adjustment input node comprises:
a coarse increase adjustment input node; and
a coarse decrease adjustment input node.

39. The integrated circuit of claim 36 further comprising an output driver responsive to the signal on the output node of the variable delay line.

40. The integrated circuit of claim 39 wherein the output driver is a synchronous element having a clock input node, and the clock input node is coupled to the output node of the variable delay line.

41. The integrated circuit of claim 39 wherein the output driver includes an output enable input node coupled to the output node of the variable delay line.

42. The integrated circuit of claim 36 wherein the integrated circuit is a memory device.

43. The integrated circuit of claim 36 wherein the integrated circuit is an application specific integrated circuit.

44. The integrated circuit of claim 36 wherein the integrated circuit is a processor.

45. A processing system comprising:
a processor; and
a memory having a delay lock loop comprising:
   a variable delay line including a plurality of delay cells and an input connected to receive an external signal;
   a shift register having a plurality of storage elements, each of the plurality of storage elements corresponding to one of the plurality of delay cells, the plurality of storage elements being arranged in a plurality of blocks of storage elements, the shift register having a fine control input node, and a coarse control input node;
   a phase detector having a fine adjustment output node coupled to the fine control input node, and having a coarse adjustment output node coupled to the coarse control input node node the phase detector further comprising:
      a first phase comparator operable for comparing a phase of the external signal to a phase of a variable delay signal output from the variable delay line and producing therefrom a first delay amount signal on the fine adjustment output node; and
      a second phase comparator operable for comparing a phase of a delayed version of the external signal to the variable delay signal output from the variable delay line and producing therefrom a second delay amount signal on the coarse adjustment output node.

46. The processing system of claim 45 wherein the shift register is configured to shift one of the plurality of blocks of storage elements in response to an asserted signal on the coarse control input node, such that the variable delay line changes by more than one of the plurality of delay cells in response to the asserted signal.

47. The processing system of claim 45 wherein the variable delay line includes an input node and an output node, and wherein the phase detector is configured to measure a phase difference between a signal on the input node of the variable delay line and a signal on the output node of the variable delay line.

48. A processing system comprising:
a processor; and
a memory having a delay lock loop that includes a phase detector comprising:
   a first input node, a second input node, a first output node, and a second output node;
   a first phase comparator coupled between the first input node, the second input node, and the first output node;
   a first delay line coupled to the first input node; and
   a second phase comparator coupled between the first delay line, the second input node, and the second output node;
a third output node;
a second delay line coupled to the second input node; and
a third phase comparator coupled between the first input node, the second delay line, and the third output node.

49. A processing system comprising:
a processor; and
a memory having a delay lock loop that includes a variable delay line comprising:
   a coarse adjustment portion comprising a first plurality of delay cells and a first shift register;
   a fine adjustment portion comprising a second plurality of delay cells and a second shift register, wherein each of the first plurality of delay cells has a delay value larger than that of each of the second plurality of delay cells;
   a first phase comparator operable for comparing a phase of an external clock signal to a phase of a internal clock signal output from the variable delay line and producing therefrom a first delay amount signal connected to control the fine adjustment portion; and
   a second phase comparator operable for comparing a phase of a delayed version of the external clock signal and a phase of internal clock signal and producing therefrom a second delay amount signal connected to control the coarse adjustment portion.

50. The processing system of claim 49 wherein the first shift register is configured to be responsive to coarse adjustment signals from a phase detector.

51. The processing system of claim 50 wherein the second shift register is configured to be responsive to fine adjustment signals from a phase detector.

* * * * *

UNITED STATES PATENT AND TRADEMARK OFFICE
CERTIFICATE OF CORRECTION

PATENT NO.    : 6,959,062 B1
DATED         : October 25, 2005
INVENTOR(S)   : Stubbs It is certified that error appears in the above-identified patent and that said Letters Patent is hereby corrected as shown below:

Column 9,
Line 1, delete "ommitted" and insert -- omitted --.
Line 67, after "second control signal" insert -- a first amount and a second amount respectively --.

Column 10,
Lines 4-5, after "signal" delete "a first amount and a second amount respectively".

Column 15,
Line 21, after "node" delete "node".

Signed and Sealed this

Seventh Day of February, 2006

JON W. DUDAS
*Director of the United States Patent and Trademark Office*